United States Patent
Perner et al.

(10) Patent No.: US 6,757,188 B2
(45) Date of Patent: Jun. 29, 2004

(54) TRIPLE SAMPLE SENSING FOR MAGNETIC RANDOM ACCESS MEMORY (MRAM) WITH SERIES DIODES

(75) Inventors: Frederick A. Perner, Palo Alto, CA (US); Lung T. Tran, Saratoga, CA (US); Kenneth J. Eldredge, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/151,915

(22) Filed: May 22, 2002

(65) Prior Publication Data

US 2003/0218902 A1 Nov. 27, 2003

(51) Int. Cl.[7] .............................................. G11C 11/00
(52) U.S. Cl. .................. 365/158; 365/175; 365/189.09
(58) Field of Search ................................ 365/158, 175, 365/189.07, 189.09

(56) References Cited

U.S. PATENT DOCUMENTS

| | | | |
|---|---|---|---|
| 5,640,343 A | 6/1997 | Gallagher et al. | 365/171 |
| 6,188,615 B1 | 2/2001 | Perner et al. | 365/189.01 |
| 6,259,644 B1 | 7/2001 | Tran et al. | 365/209 |
| 6,317,376 B1 * | 11/2001 | Tran et al. | 365/210 |
| 6,385,111 B2 * | 5/2002 | Tran et al. | 365/210 |

* cited by examiner

Primary Examiner—Van Thu Nguyen

(57) ABSTRACT

A data storage device that includes an array of resistive memory cells. The resistive memory cells may include a magnetic tunnel junction (MTJ) and a thin-film diode. The device may include a circuit that is electrically connected to the array and that is also capable of monitoring a signal current flowing through a selected memory cell. Once the signal current has been monitored, the circuit is capable of comparing the signal current to an average reference current in order to determine which of a first resistance state and a second resistance state the selected memory cell is in. Also, a method for operating the data storage device.

18 Claims, 7 Drawing Sheets

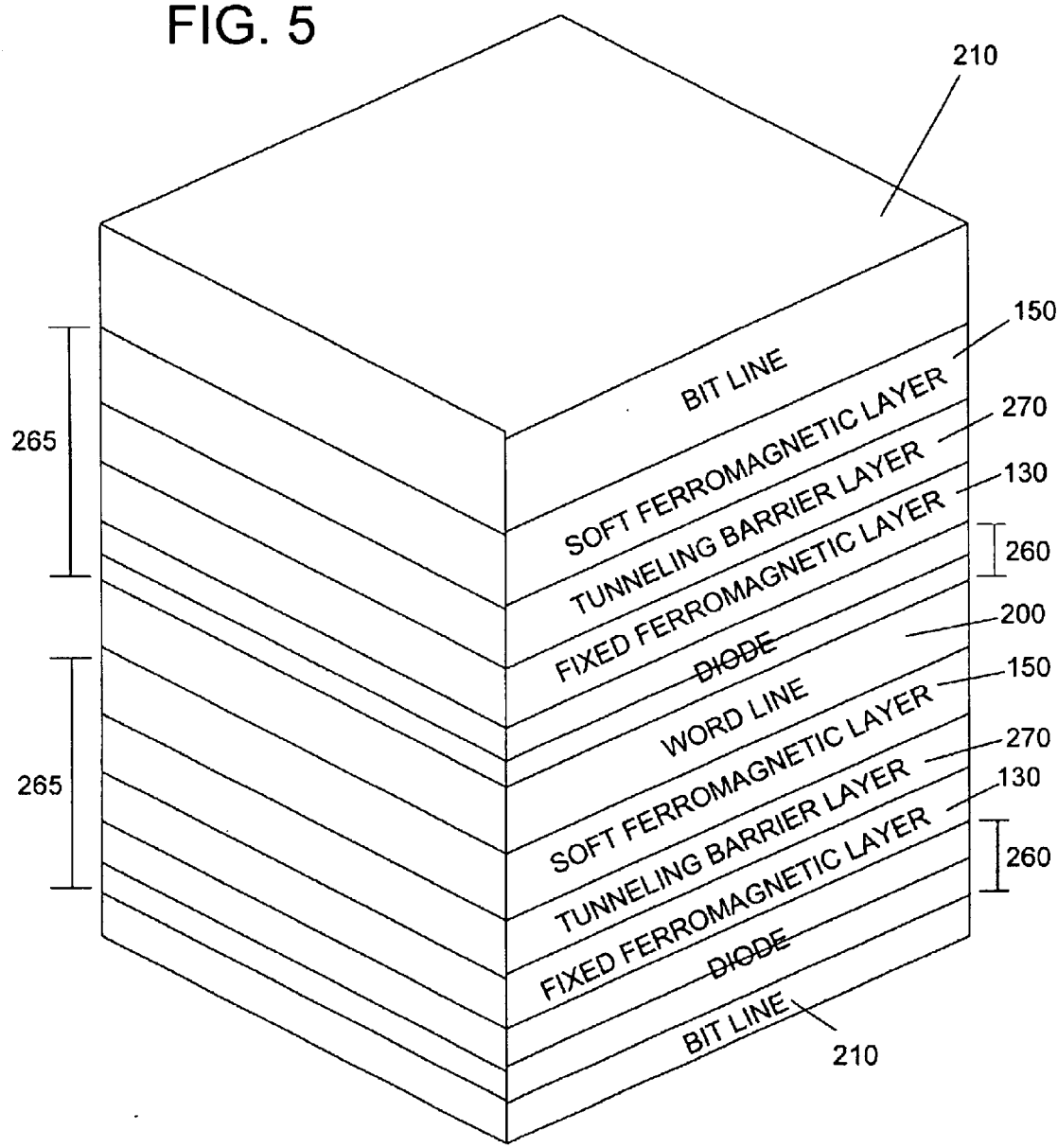

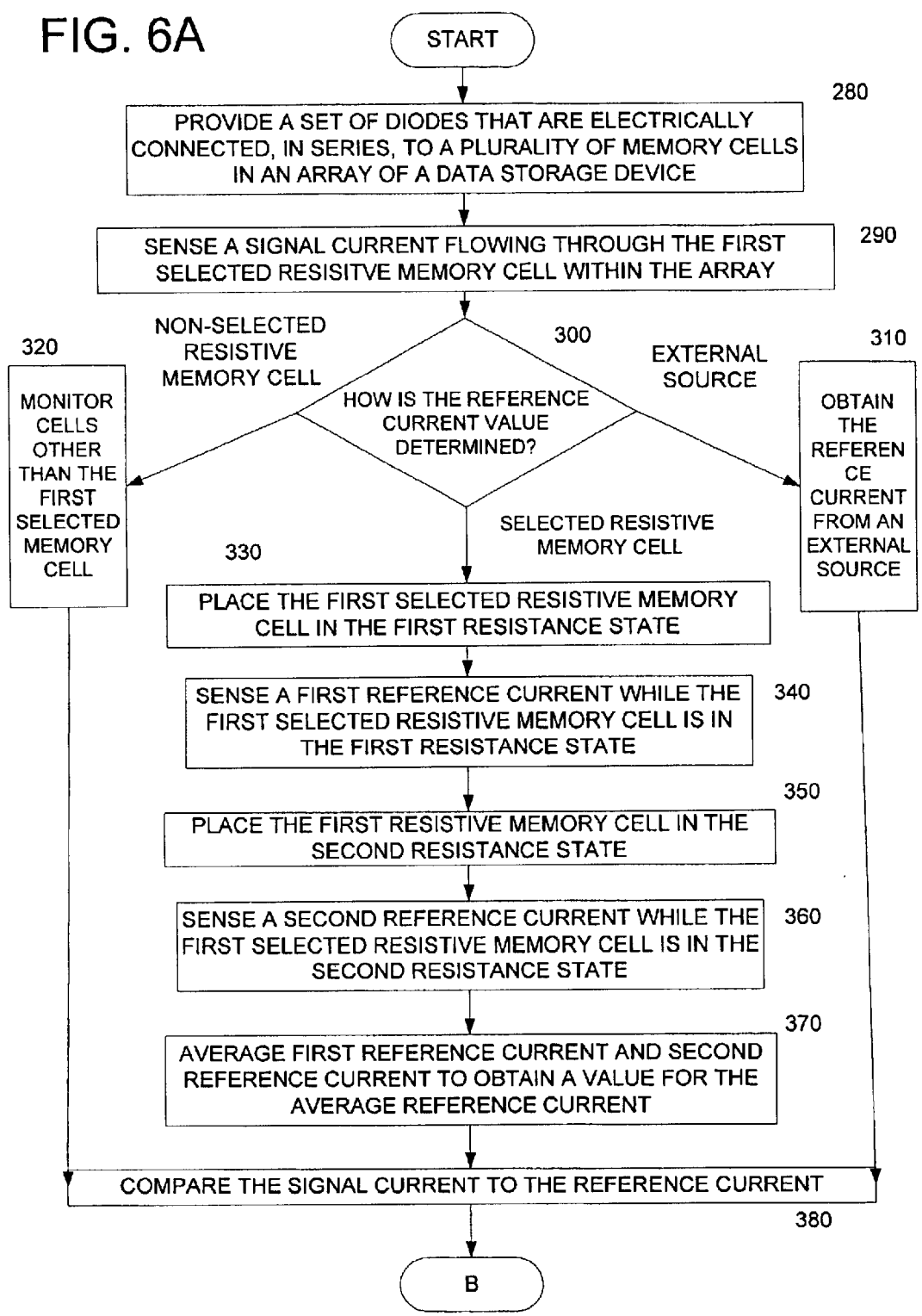

TRIPLE SAMPLE SENSING FOR MAGNETIC RANDOM ACCESS MEMORY (MRAM) WITH SERIES DIODES

CROSS-REFERENCES TO RELATED APPLICATIONS

This application is related to U.S. patent application Ser. No. 10/151,913 to Fred Perner et al., entitled "EQUIPOTENTIAL SENSING MAGNETIC RANDOM ACCESS MEMORY (MRAM) WITH SERIES DIODES", filed on same date herewith, and to U.S. patent application Ser. No. 10/151,914 to Fred Perner et al., entitled "MEMORY CELL ISOLATION", also filed on same date herewith. These applications are incorporated herein in their entirety by reference.

BACKGROUND

The related art discloses non-volatile magnetic random access memory (MRAM) cells that are positioned in an array 10, as illustrated in FIG. 1. The array 10 includes a plurality of word lines 20 that extend along rows of the array 10 and a plurality of bit lines 30 that extend along columns of the array 10. The word lines 20 and bit lines 30 criss-cross each other and intersect. Between the word lines 20 and bit lines 30, at locations where they intersect, are included MRAM memory cells 40 that each include a magnetic tunnel junction (MTJ) 50 and a silicon junction diode 60 (illustrated in FIG. 2).

FIG. 2 illustrates a side perspective view of an MRAM memory cell 40 as disclosed in the related art. FIG. 2 shows an n-type silicon layer 70 in contact with a word line 20 (not shown). On top of the n-type silicon layer 70 is a p-type silicon layer 80 that, together with the n-type silicon layer 70, make up the silicon junction diode 60. Adjacent to this silicon junction diode 60 is formed a tungsten stud layer 90 and a template layer 100. Above the template layer 100 are a ferromagnetic layer 110, an anti-ferromagnetic layer 120, a fixed ferromagnetic layer 130, a tunneling barrier layer 140, a soft ferromagnetic layer 150, and a contact layer 160 that provides an electrical contact to a bit line 30 (shown in FIG. 1).

In operation, the MRAM memory cell 40 has data bits written to it and read from it. Initially, the MRAM memory cell 40 may be in a first resistance state, also known as a parallel state, where the soft ferromagnetic layer 150 is in a first direction of magnetization that is the same direction of magnetization as that of the fixed ferromagnetic layer 130. Alternately, the MRAM memory cell 40 may be in a second resistance state, also known as an anti-parallel state, where the soft ferromagnetic layer 150 is in a second direction of magnetization that is different from the direction of magnetization of the fixed ferromagnetic layer 130.

When writing to an MRAM memory cell 40 in the array 10, potentials are applied to both the word line 20 and bit line 30 that are adjacent to the MRAM memory cell 40. These potentials generate currents that travel through the word line 20 and the bit line 30 to which they are applied. These currents, in turn, generate magnetic fields that are coupled to the selected MRAM memory cell 40 and that are of a sufficient combined magnitude to alter the direction of magnetization of the soft ferromagnetic layer 150. Hence, when being written to, the MRAM memory cell 40 may experience a measurable increase in resistance if the coupled magnetic fields change the cell 40 from the first resistance state to the second resistance state. On the other hand, if the MRAM memory cell 40 is changed, by the coupled magnetic fields, from the second resistance state to the first resistance state, the cell 40 will experience a measurable decrease in resistance.

In other words, the resistance of an MRAM memory cell 40 is a function of the relative directions of magnetization of the fixed ferromagnetic layer 130 and of the soft ferromagnetic layer 150. When the directions of magnetization are parallel, the resistance is measurably lower than the when the directions of magnetization are anti-parallel.

During a reading step, the resistance of the MRAM memory cell 40 is detected by passing an amount of current through the MRAM memory cell 40. Then, the resistance of the cell 40 is monitored and, by sensing whether the MRAM memory cell 40 is in a high resistance state or a low resistance state, it is possible to determine whether the MRAM memory cell 40 is in the parallel or anti-parallel state. In other words, it is possible to determine whether the MRAM memory cell 40 contains a "0" data bit or a "1" data bit.

Among the disadvantages of the devices illustrated in FIGS. 1 and 2 is the fact that many diodes 60 and MRAM memory cells 40 are typically included in an array 10 and that the diodes 60 and MRAM memory cells 40 may not have a tight distributions of resistances values. Hence, what may be a resistance value for the high resistance state in one MRAM memory cell 40 may be the resistance value for the low resistance state in another MRAM memory cell 40. In the absence of a tight distribution of resistances values, the data bits in the MRAM memory cells 40 may be read erroneously.

SUMMARY

A data storage device consistent with the present invention includes an array of resistive memory cells and a set of diodes electrically connected in series to a plurality of memory cells in the array. A plurality of word lines extend along rows of the array and a plurality of bit lines extend along columns of the array. A first selected memory cell in the array is positioned between a first word line in the plurality of word lines and a first bit line in the plurality of bit lines. A circuit is electrically connected to the array and capable of monitoring a signal current flowing through the first selected memory cell and comparing the signal current to an average reference current in order to determine which of a first resistance state and a second resistance state the first selected memory cell is in.

A method consistent with the present invention senses a resistance state of a first selected memory cell in a data storage device that includes an array of resistive memory cells. The method includes providing a set of diodes electrically connected in series to a plurality of memory cells in the array, sensing a signal current flowing through the first selected memory cell with the array, comparing the signal current to an average reference current, and determining which of a first resistance state and a second resistance state the first selected memory cell is in by comparing the signal current to the reference current.

DESCRIPTION OF THE DRAWINGS

Data storage devices and methods will be described, by way of example, in the description of exemplary embodiments, with particular reference to the accompanying drawings in which like numerals refer to like elements and:

FIG. 5 illustrates a side perspective view of two resistive memory cells in a stacked configuration; and FIGS. 6A–B include a flowchart of methods that may be used to read data from a data storage device.

DETAILED DESCRIPTION

Figure 1:
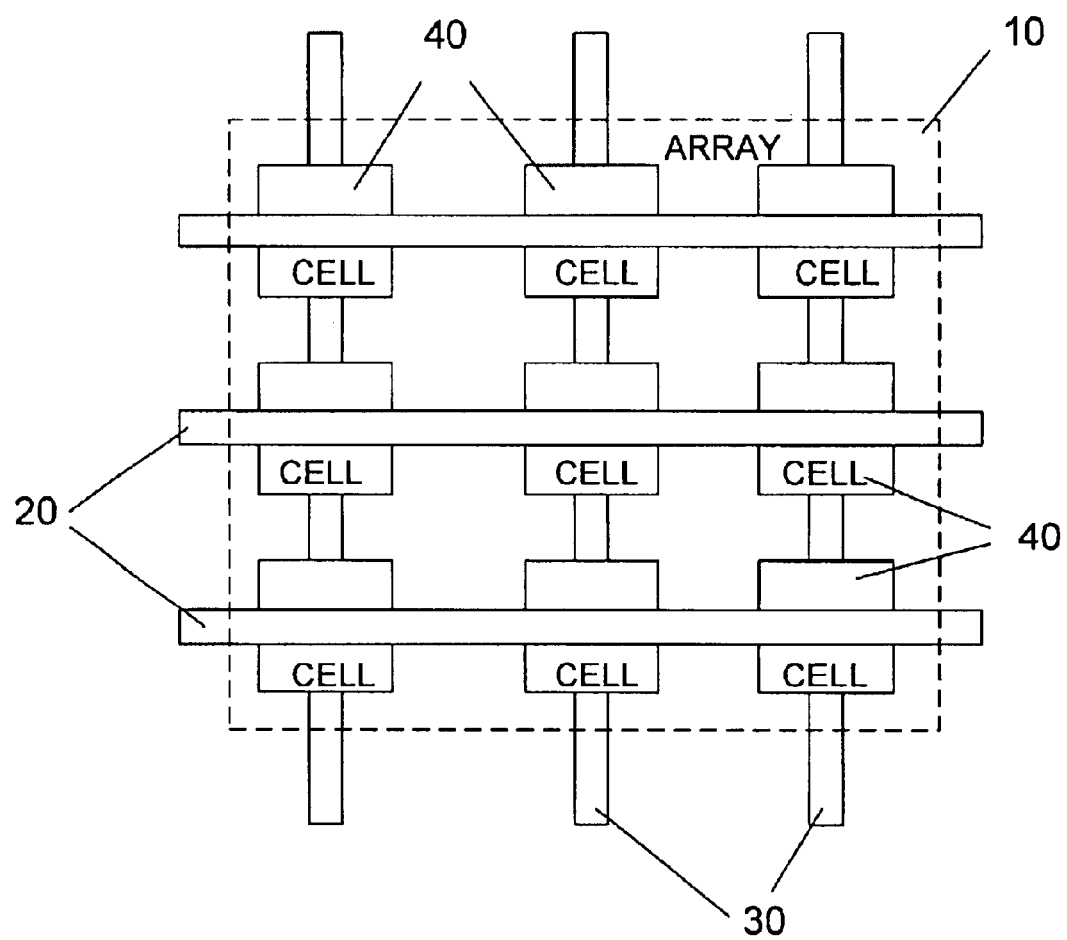
FIG. 1 illustrates a plan view of an array of MRAM memory cells according the related art.
Figure 2:
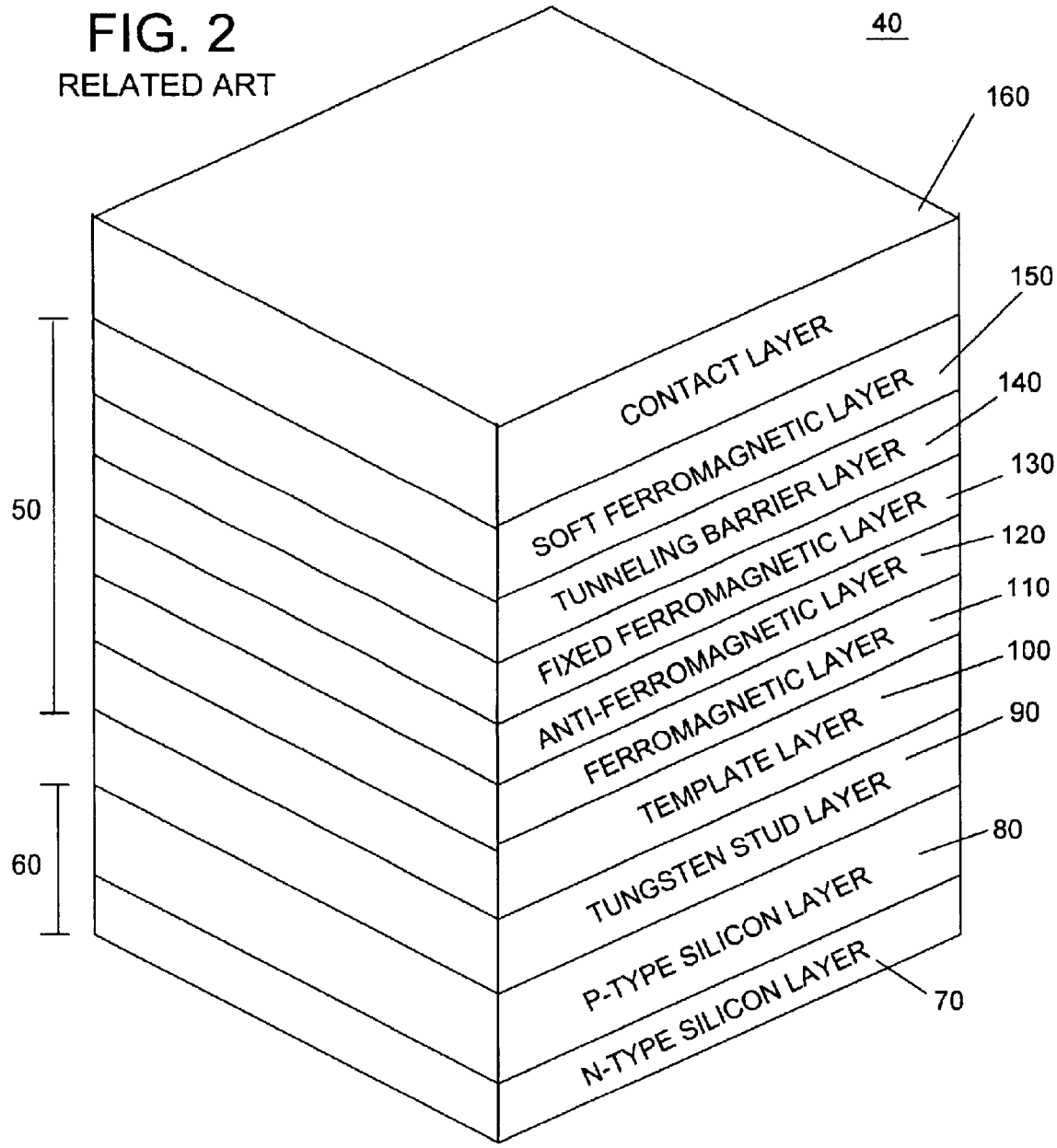
FIG. 2 illustrates a side perspective view of an MRAM memory cell according to the related art.
Figure 3:
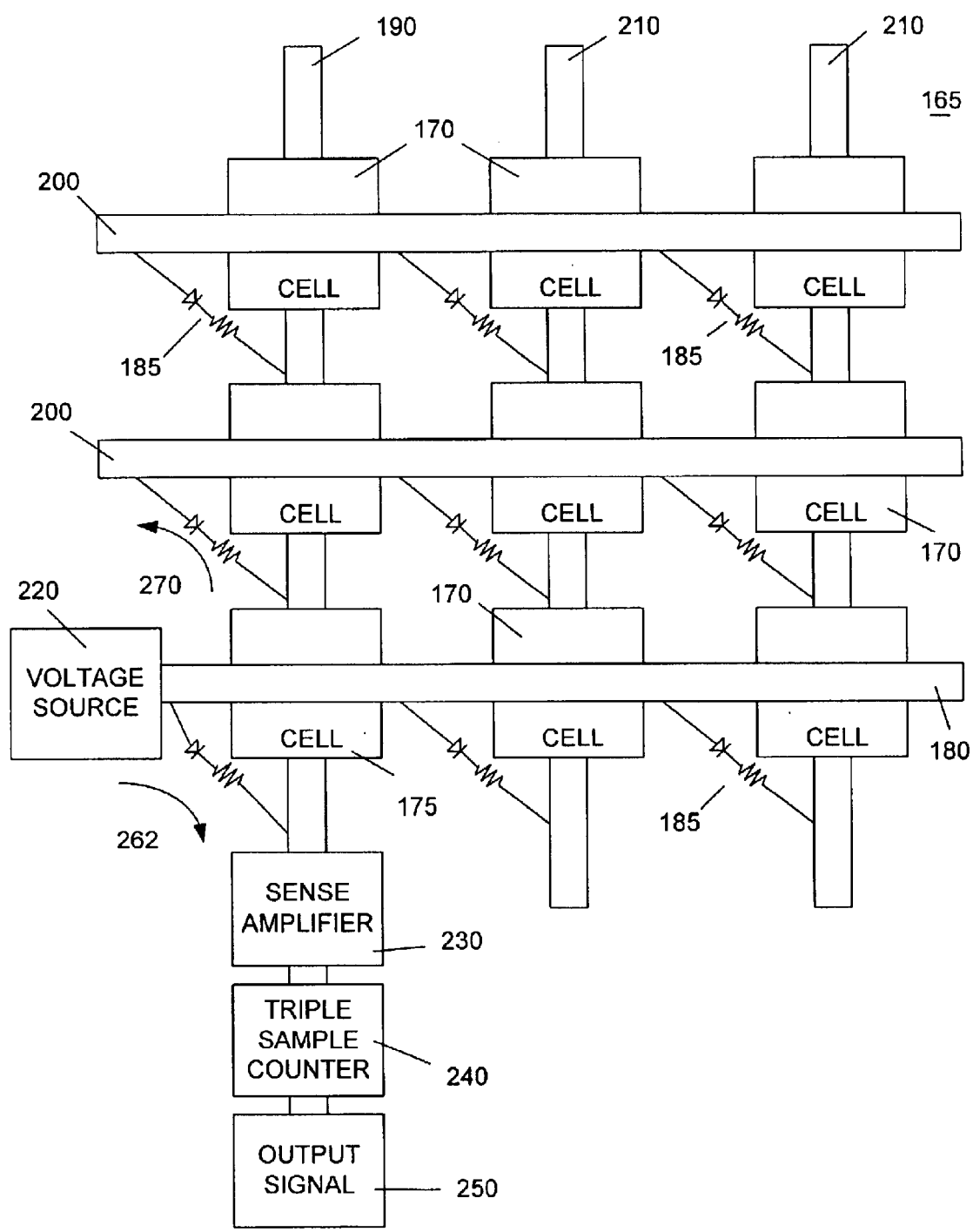
FIG. 3 illustrates a plan view of a resistive memory cell array, circuitry electrically connected to the array, equivalent circuits representing components in the array, and current paths in the array.

FIG. 3 illustrates an array 165 of resistive memory cells 170. The array 165 includes one selected word line 180, one selected bit line 190, and one selected resistive memory cell 175, located at the intersection of the selected word line 180 and the selected bit line 190. The array 165 also includes numerous unselected word lines 200, numerous unselected bit lines 210, and a plurality of unselected resistive memory cells 170, positioned at the intersections of word lines 180, 200, and bit lines 190, 210.

FIG. 3 also illustrates a circuit that is electrically connected to the array 165. The circuit illustrated includes a voltage source 220 that is electrically connected to the selected word line 180. The circuit illustrated also includes a sense amplifier 230 that is electrically connected to the selected bit line 190 and a triple sample (TS) counter 240 that is electronically connected to the sense amplifier 230. The triple sample counter 240 can emit an output signal 250.

Figure 4:
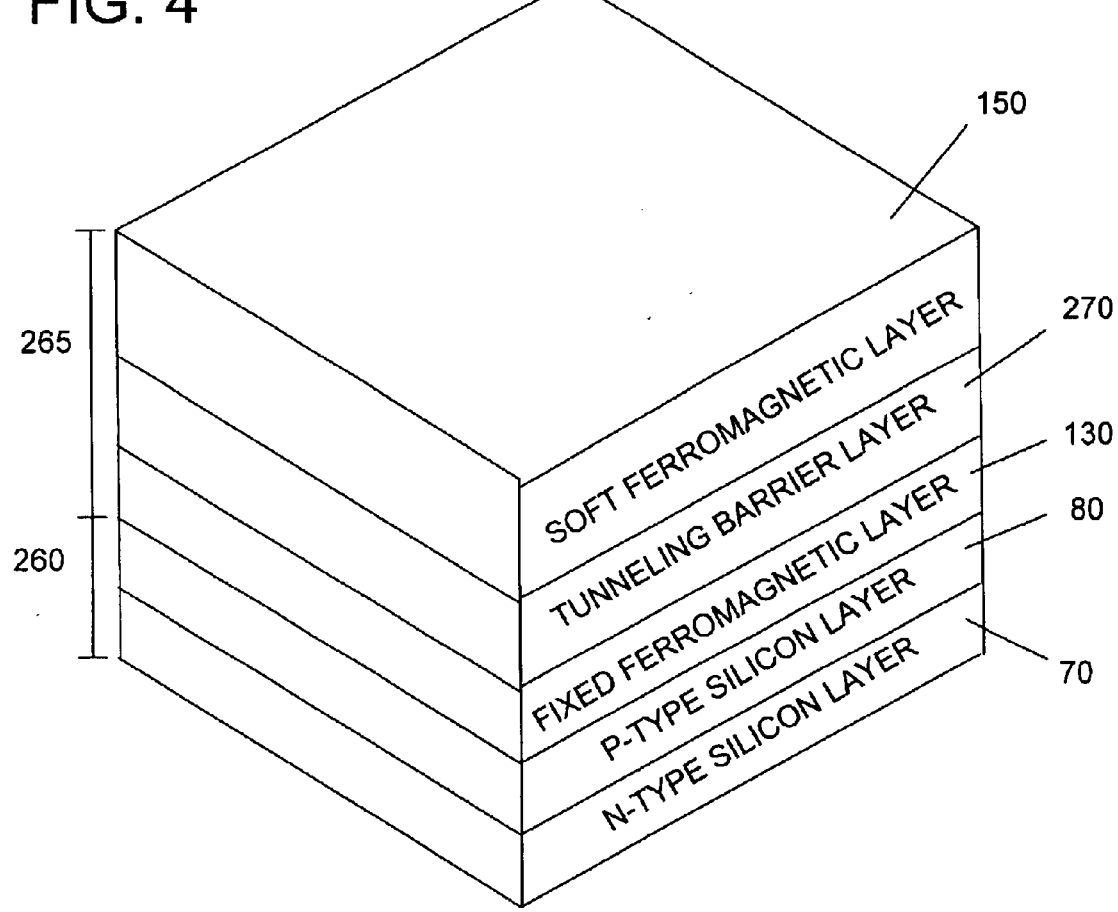
FIG. 4 illustrates a side perspective view of one embodiment of a resistive memory cell that may be included in the array illustrated in FIG. 3.

FIG. 4 illustrates one possible resistive memory cell 170 configuration that may be used in the array 165 illustrated in FIG. 3. A diode 260 is illustrated at the bottom of FIG. 4, and an MRAM memory cell 265 is illustrated adjacent to the diode 260. Both the MRAM memory cell 265 and the diode 260 may be positioned between a word line 180, 200 and a bit line 190, 210. Further, the diode 260 and the MRAM memory cell 265 may be electronically connected in series with each other.

The diode 260 may be a thin-film diode made from any material known in the art and may take any geometry known in the art. The MRAM memory cell 265 may include the fixed ferromagnetic layer 130, tunnel junction 270, and soft ferromagnetic layer 150 illustrated in FIG. 4. In addition, the MRAM memory cell 265 may include any of the layers illustrated in FIG. 3 and any additional layers that one skilled in the art would know to use in conjunction with, or as a part of, an MRAM memory cell 265.

FIG. 5 illustrates a configuration of a data storage device wherein two resistive memory cells 170 are stacked upon each other and wherein both resistive memory cells 170 are MRAM memory cells 265. The MRAM memory cell 265 illustrated in the lower portion of FIG. 5 is surrounded by a lower bit line 210 and a word line 200. Above the word line 200 is positioned a second MRAM memory cell 265, complete with a diode 260. The second MRAM memory cell 265 is capped by an upper bit line 210. The lower MRAM memory cell 265 in FIG. 5 may be positioned in a first layer of the array 165 shown in FIG. 3 and the second MRAM memory cell 265 may be positioned in a second layer that is stacked upon the first layer. Stacking memory cells, as shown in FIG. 5, can increase the data storage density of a data storage device. Although MRAM memory cells 265 are illustrated in FIG. 5, other types of resistive memory cells 170 may be used in data storage devices. Also, more than two cells 170 may be stacked.

The circuit illustrated in FIG. 3 has previously been described, along with additional components, in U.S. Pat. No. 6,188,615 B1 to Perner et al. (the '615 patent). The entire contents of the '615 patent are incorporated herein by reference. Circuit components particularly relevant to the data storage device illustrated in FIG. 3 will be discussed herein, with the understanding that any or all circuit components disclosed in the '615 patent may be used in conjunction with the array 165.

In operation, the data storage device illustrated in FIG. 3 may apply a voltage (or a ground) to the selected word line 180 with a voltage source 220. An additional voltage or ground may be applied to the selected bit line 190 with the sense amplifier 230. Although the bottom word line and left-most bit line are selected in FIG. 3, any bit line and word line may be chosen and any of the resistive memory cells 170 may become the selected resistive memory cell 175. Further, although only nine resistive memory cells 170 are illustrated in FIG. 3, no restriction is made upon the number of resistive memory cells 170 that may be used in the data storage device.

The selected resistive memory cell 175, when it is an MRAM memory cell 265, may be written to using the circuit by having currents passed from the circuit and through the selected word line 180 and the selected bit line 190 connected to the MRAM memory cell 265. Magnetic fields generated by the currents in the selected word line 180 and the selected bit line 190, respectively, are then coupled into the soft ferromagnetic layer 150. When the sum of the coupled magnetic fields exceeds a threshold value, the direction of the magnetic field in the soft ferromagnetic layer 150 may be altered from a first direction of magnetization to a second direction of magnetization. This alteration also changes the cell resistance from a first resistance state to a second resistance state. In other words, the circuit can apply sufficient current or energy to the selected word line 180 and the selected bit line 190 to transform the selected resistive memory cell 175 from a first resistance state to a second resistance state.

Also, if it is desired to write to all resistive memory cells 170, 175 at the same time, an external magnetic field may be used. For example, a strong external magnetic field may be used to set the direction of magnetization of the soft ferromagnetic layers 150 during the initial setup of the array 165.

The circuit electrically connected to the resistive memory cells 170 of the data storage device can monitor the value of a signal current flowing through the selected resistive memory cell 175. The signal current value can then be compared to an average reference current value in order to determine which of the first resistance state or the second resistance state the selected resistive memory cell 175 is in. This can be accomplished by using the triple sample counter 240 and a triple sample sensing method.

According to the triple sample sensing method, after obtaining the signal current value, the circuit obtains the average reference current value by placing the selected resistive memory cell 175 in a known first resistance state, such as the least resistive state or the state of greatest possible resistance. This may be done by altering the direction of magnetization of the soft ferromagnetic layer 150 to be substantially either parallel or anti-parallel to the direction of magnetization of the fixed ferromagnetic layer 130. The circuit then records the value of a first reference current that flows through the selected restrictive memory cell 175 while it is in the known first resistance state.

Then, the circuit places the selected restrictive memory cell 175 in a second known resistance state, which is as opposed as possible to the resistance of the first resistance state. For example, if the first resistance state is chosen to have the least resistance, then the second resistance state may be chosen to provide the greatest possible resistance. The circuit can then sense the value of the second reference current that flows through the selected resistive memory cell 175, while it is in the second resistance state.

At that point, the circuit averages the values of the first reference current and of the second referenced current to obtain an average reference current value. Then, the originally monitored signal current value is compared to the average reference current value to determine whether the selected resistive memory cell 175 stored a "0" or "1" data bit.

The sensing of the various currents discussed above may be performed through the sense amplifier 230, recorded through the triple sample counter 240, and emitted as an output signal 250. In some cases, higher-order data bits, such as "2" or "3" data bits, may also be stored in the data storage device, so long as the circuit is able to distinguish between the characteristic resistances of the higher-order data bits.

Once an average reference current value has been determined and has been compared to the originally monitored signal current value, the circuit can return the selected resistive memory cell 175 to the state that emitted the originally monitored signal current value. This effectively returns the selected resistive memory cell 175 to the state that it was in before the average reference current value was determined via the triple sample sensing method.

In alternate embodiments of the data storage device, the circuit can obtain the average reference current value from an externally supplied source. Then, the average reference value may be compared to the signal current value to determine whether the selected resistive memory cell 175 is in the first or second resistance state.

According to yet other embodiments, the circuit can obtain the average reference current value by monitoring resistive memory cells 170 other than the selected resistive memory cell 175. More specifically, the circuit can sometimes determine the average reference current value by performing portions of the triple sample sensing method on one or more other resistive memory cells 170 in the array 165 illustrated in FIG. 3 and can obtain an average reference current value to which the value of the current flowing through the selected resistive memory cell 175 may be compared.

The diodes 260 that are illustrated in FIGS. 4 and 5 can reduce or prevent undesired currents from flowing through unselected resistive memory cells 170 in the array 165 The reasons for the reduction or prevention of undesired currents can be understood by studying the equivalent circuit elements 185 in FIG. 3. These elements represent the resistive memory cells 170 with diodes 260 that are connected in series and may be implemented with conventional circuit components, as illustrated, or with any type of circuit components configured to perform the same or equivalent functions.

In a data storage device, when the voltage source 220 applies a voltage to the selected word line 180, current flows from the voltage source 220, through a low-resistance sense path 262, and on to the sense amplifier 230 and the remainder of the circuit. However, undesired current 270 that attempts to travel through unselected resistive memory cells 170 electrically connected to the selected bit line 190 is substantially prevented from doing so by the diode 260 in the resistive memory cell 170 illustrated above the selected resistive memory cell 175 in FIG. 3. Hence, the undesired current 270 in the data storage device is reduced by the use of diodes 260

Another advantage of the data storage device illustrated in FIG. 3 is that the series diodes 260 increase the effective impedance through the unselected memory cells 170. The high impedance reduces the attenuation of the current sensed by the sense amplifier 230 and has been shown to reduce the sensor noise. Both effects combined yield a greater signal-to-noise figure of merit in MRAM circuits with series diodes 260.

Yet another advantage or benefit of the series diodes is to improve write current uniformity. This is accomplished because of the increased resistance through unselected paths through the MRAM array during write operations.

Figure 6B:
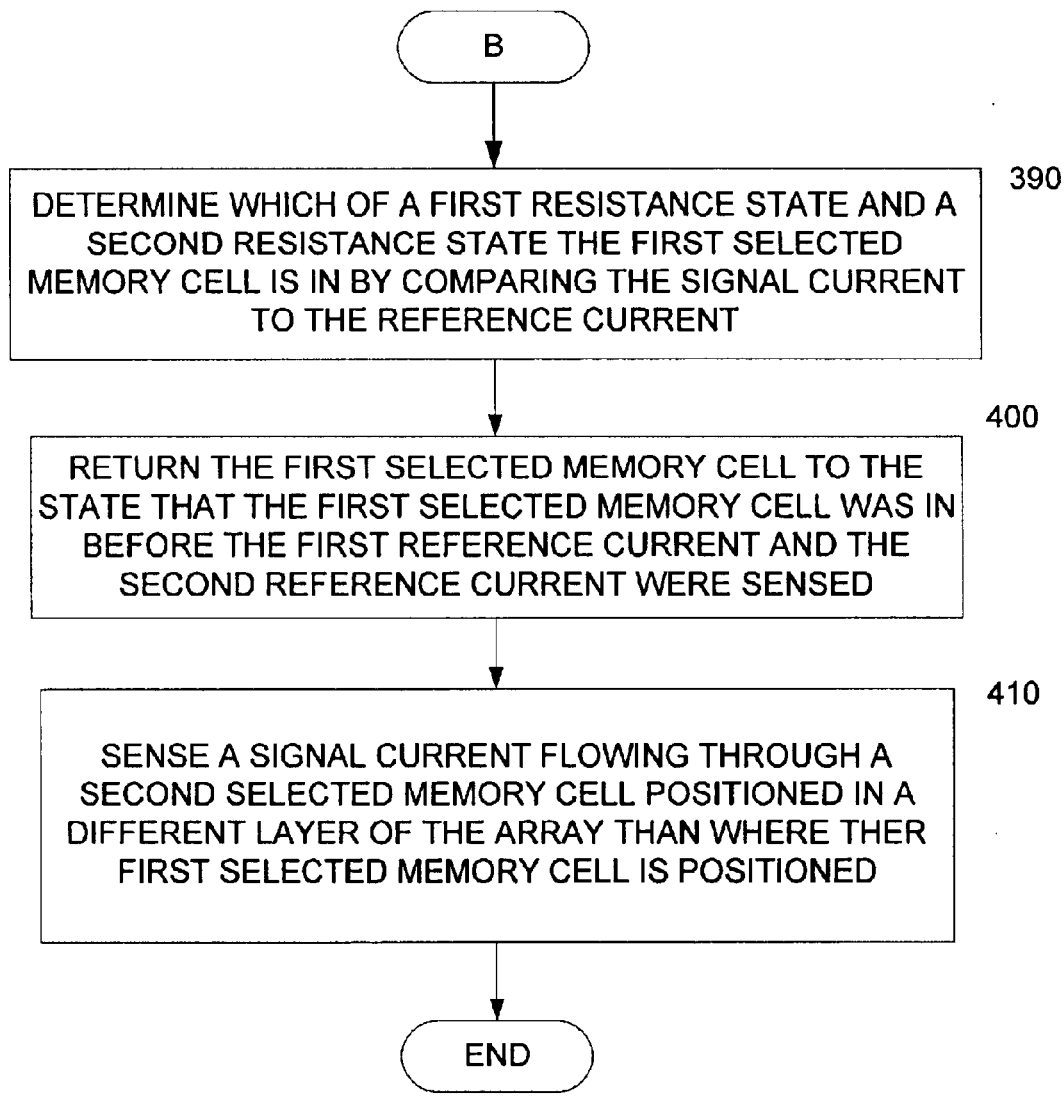

FIGS. 6A–B illustrate a flowchart that includes steps of methods for operating data storage devices that include resistive memory cells 170 with diodes 260. These methods include the triple sample sensing method described above and may be used in conjunction with MRAM memory cells 265 with series diodes 260.

The first step illustrated in FIGS. 6A–B, step 280, specifies that a set of diodes 260 be provided in a data storage device such as the device illustrated in FIG. 3. The diodes 260 may be electrically connected in series to a plurality of resistive memory cells 170 in an array 165. One diode 260 may be connected to each resistive memory cell 170, which may be an MRAM memory cell 265. However, not all resistive memory cells 170 need to be connected to a diode 260.

Step 290 specifies that a signal current be sensed as it flows through a first selected resistive memory cell 175 within the array 165. Step 300 then allows for a determination to be made as to what kind of reference current value will be used to determine whether the first selected resistive memory cell 175 contains a "0" or "1" data bit. Specifically, a choice can be made between obtaining the reference current value from an external source, an unselected resistive memory cell 170, or the selected resistive memory cell 175.

If an external source is used to obtain the reference current value, then step 310 merely specifies obtaining the reference current from the external source of choice. If an unselected resistive memory cell 170 is to be used to determine the reference current value, then step 320 specifies that one or more resistive memory cells 170 other than the selected resistive memory cell 175 be monitored to obtain the reference current value.

If the selected resistive memory cell 175 is to be used to obtain an average reference current value, then step 330 specifies that the selected restrictive memory cell 175 be placed in the first resistance state. In other words, the first selected resistive memory cell 175 should either be placed in the highest possible resistance state (e.g. anti-parallel) or the lowest possible resistance state (e.g. parallel).

Step 340 then specifies that a first reference current be sensed while the first selected resistive memory cell 175 is in the first resistance state. Then step 350 specifies that the selected resistive memory cell 175 be placed in the second resistance state, where resistance is maximally opposed to the resistance of the first resistance state. In other words, if the first resistance state is chosen to be the state of highest resistance, then the second resistance state should be the state of lowest possible resistance.

Step 360 then specifies that a second reference current be sensed while the selected resistive memory cell 175 is in the second resistance state. Then, step 370 specifies that an average value of the first reference current and the second reference current be obtained in order to generate an average reference current value. At that point, step 380 specifies that the signal current originally detected in the first selected memory cell be compared to the reference current found above, either through the first selected resistive memory cell 175, an unselected resistive memory cell 170, or an external source.

In FIG. 6B, which is a continuation of the flowchart illustrated in FIG. 6A, step 390 specifies which of the first resistance state and the second resistance state the first selected resistive memory cell 175 is in. This is done by comparing the value of the signal current originally sensed in the first selected resistive memory cell 175 to the value of the reference current or average reference current. If the reference current or average reference current value is higher than the sensed current, then the first selected resistive memory cell 175 may contain a "1" data bit. On the other hand, if the sensed current value is lower than the reference current value, the first selected resistive memory cell 175 may contain a "0" data bit.

Once the value of the data bit has been determined, step 400 specifies that the first selected resistive memory cell 175 be restored to the state that it was in before the first reference current and the second reference current were sensed. If an external source 310 or an unselected memory cell 320 were used to determine the reference current value, step 400 may not be applicable.

Finally, step 410 specifies that a signal current flowing through a second selected resistive memory cell 175, positioned in a different layer of the array 165 than where the first selected resistive memory cell 175 is positioned, be sensed. This optional step can be used for data storage devices that include configurations such as those illustrated in FIG. 5.

The forgoing detailed description has been given for understanding exemplary implementations of data storage devices and methods for using data storage devices. No unnecessary limitations should be understood therefrom, as modifications will be obvious to those skilled in the art without departing from the scope of the appended claims and their equivalents.

What we claim is:

1. A data storage device comprising:
   an array of resistive memory cells having rows and columns;
   a set of diodes electrically connected in series to a plurality of memory cells in the array;
   a plurality of word lines extending along the rows of the array;
   a plurality of bit lines extending along the columns of the array;
   a first selected memory cell in the array, wherein the first selected memory cell is positioned between a first word line in the plurality of word lines and a first bit line in the plurality of bit lines; and
   a circuit electrically connected to the array and capable of monitoring a signal current flowing through the first selected memory cell and comparing the signal current to an average reference current in order to determine which of a first resistance state and a second resistance state the first selected memory cell is in,
   wherein the circuit is capable of obtaining the average reference current by placing the first selected memory cell in the first resistance state, sensing a first reference current while the first selected memory cell is in the first resistance state, placing the first selected memory cell in the second resistance state, sensing a second reference current while the first selected memory cell is in the second resistance state, and averaging the first reference current and the second reference current to obtain the average reference current.

2. The device of claim 1, wherein the circuit is capable of returning the first selected memory cell to an original resistance state wherein the first selected memory cell has the signal current flowing there through.

3. The device of claim 1, wherein the circuit is capable of writing to the first selected memory cell by applying sufficient energy to the first word line and the first bit line to transform the first selected memory cell from a first resistance state to a second resistance state.

4. A method of sensing a resistance state of a first selected memory cell in a data storage device that includes an array of resistive memory cells, a plurality of word lines extending along rows of the array, a plurality of bit lines extending along columns of the array, a first selected memory cell in the array, wherein the first selected memory cell is positioned between a first word line in the plurality of word lines and a first bit line in the plurality of bit lines, and a circuit electrically connected to the array, the method comprising;
   providing a set of diodes electrically connected in series to a plurality of memory cells in the array;
   sensing a signal current flowing through the first selected memory cell with the array;
   comparing the signal current to an average reference current; and
   determining which of a first resistance arrays and a second resistance state the first selected memory cell is in by comparing the signal current to the reference current, wherein the average current is determined by;
   placing the first selected memory cell in the first resistance state;
   sensing a first reference current while the first selected memory cell is in the first resistance state;
   placing the first selected memory cell in the second resistance state;
   sensing a second reference current while the first selected memory cell is in the second resistance state; and
   averaging the first referents current and the second reference current to obtain a value for the average reference current.

5. The method of claim 4, further comprising returning the (p first selected memory cell to the state that the first selected memory cell was in before the first reference current and the second reference current were sensed.

6. The device of claim 1, wherein the array of resistive memory cell comprises a magnetic random access memory (MRAM) cell.

7. The device of claim 6, wherein the MRAM memory cell comprises a tunnel junction.

8. The device of claim 1, wherein the set of diodes comprises a thin-film diode.

9. The device of claim 1, further comprising a second selected memory cell in the array, wherein the first selected memory cell is in a first layer of the array and wherein the second selected memory cell is in a second layer of the array.

10. The device of claim 1, wherein the circuit is capable of obtaining the average reference current from an externally supplied source.

11. The device of claim 1, wherein the circuit is capable of obtaining the average reference current by monitoring memory cells other than the first selected memory cell.

12. The method of claim 4, wherein the providing step comprises providing a set of thin-film diodes.

13. The method of claim 4, wherein the sensing step comprises sensing the signal current flowing through an magnetic random access memory (MRAM) cell.

14. The method of claim 4, wherein the sensing step comprises sensing the signal current flowing through the MRAM memory cell that includes a tunnel junction.

15. The method of claim 14, wherein the determining step comprises determining which of an anti-parallel ferromagnetic state and a parallel ferromagnetic state the MRAM memory cell is in.

16. The method of claim 4, further comprising obtaining the average reference current from an externally supplied source.

17. The method of claim 4, further comprising obtaining the average reference current by monitoring cells other than the first selected memory cell.

18. The method of claim 4, further comprising sensing a signal current flowing through a second selected memory cell positioned in a different layer of the array than where the first selected memory cell is positioned.

* * * * *